United States Patent
Ishibashi et al.

(10) Patent No.: US 8,069,704 B2
(45) Date of Patent: Dec. 6, 2011

(54) SEALING STRUCTURE OF PLASMA PROCESSING APPARATUS, SEALING METHOD, AND PLASMA PROCESSING APPARATUS INCLUDING THE SEALING STRUCTURE

(75) Inventors: Kiyotaka Ishibashi, Amagasaki (JP); Yoshiharu Kishida, Amagasaki (JP)

(73) Assignee: Tokyo Electron Limited (JP)

( * ) Notice: Subject to any disclaimer, the term of this patent is extended or adjusted under 35 U.S.C. 154(b) by 372 days.

(21) Appl. No.: 12/419,574

(22) Filed: Apr. 7, 2009

(65) Prior Publication Data

US 2009/0255324 A1   Oct. 15, 2009

(30) Foreign Application Priority Data

Apr. 9, 2008   (JP) ................ 2008-101422

(51) Int. Cl.
   *G01M 3/02*   (2006.01)
(52) U.S. Cl. .......................................................... 73/37
(58) Field of Classification Search ............ 73/37–37.9
   See application file for complete search history.

(56) References Cited

U.S. PATENT DOCUMENTS

| | | | |
|---|---|---|---|
| 6,962,348 B2 | 11/2005 | Fink | |
| 7,930,992 B2 * | 4/2011 | Nozawa et al. | 118/723 MW |
| 2006/0054280 A1* | 3/2006 | Jang | 156/345.34 |
| 2006/0055014 A1* | 3/2006 | Tsurume et al. | 257/678 |
| 2008/0000530 A1* | 1/2008 | Sun et al. | 137/487.5 |
| 2008/0302761 A1* | 12/2008 | Hirayama et al. | 216/67 |

FOREIGN PATENT DOCUMENTS

| | | |
|---|---|---|
| JP | 61-192339 | 8/1986 |
| JP | 06-112168 | 4/1994 |
| JP | 2000-182958 | 6/2000 |
| JP | 2004-099924 | 4/2004 |
| JP | 2004-141803 | 5/2004 |

OTHER PUBLICATIONS

Notice of Preliminary Rejection issued by Korean Patent Office on Jan. 11, 2011, citing JP61-192339 and US6,962,348.

* cited by examiner

*Primary Examiner* — Max Noori
(74) *Attorney, Agent, or Firm* — Cantor Colburn LLP

(57) ABSTRACT

A gate valve corresponding to the sealing structure seals an opening of a plasma generation chamber and includes a valve body, a valve stem, and ring-shaped first and second sealing members that seal a gap between the valve body and the plasma generation chamber. The first ring-shaped sealing member is on the side of the plasma generation chamber and is exposed to a plasma atmosphere. The first and second ring-shaped sealing members do not contact each other, that is, a gap is formed therebetween. A plurality of gas grooves are arranged in the length direction of the first ring-shaped sealing member. The gas grooves are formed by cutting the valve body in a direction almost perpendicular to the length direction of the first ring-shaped sealing member, and the gap is in communication with the plasma generation chamber via the gas grooves. A gas injection passage 14 for injecting a gas into the gap is formed in the wall of the plasma generation chamber. A concave portion extending along the length direction of the first ring-shaped sealing member is formed on the surface of the plasma generation chamber, and the concave portion is connected to a gas outlet of the gas injection passage.

21 Claims, 6 Drawing Sheets

SEALING STRUCTURE OF PLASMA PROCESSING APPARATUS, SEALING METHOD, AND PLASMA PROCESSING APPARATUS INCLUDING THE SEALING STRUCTURE

CROSS-REFERENCE TO RELATED PATENT APPLICATIONS

This application claims the benefit of Japanese Patent Application No. 2008-101422, filed on Apr. 9, 2008, in the Japan Patent Office, the disclosure of which is incorporated herein in its entirety by reference.

BACKGROUND OF THE INVENTION

1. Field of the Invention

The present invention relates to a sealing structure of a plasma processing apparatus, a sealing method, and a plasma processing apparatus including the sealing structure.

2. Description of the Related Art

Plasma technology is being widely used for manufacturing variety of semiconductor devices, such as integrated circuits, liquid crystal displays, solar batteries, etc. Plasma technology is used in thin film formation, thin film etching, or other operations included in a semiconductor manufacturing process. However, a highly accurate plasma process, for example, a super-fine processing technique, is required to achieve high-performance, high-functional products. In particular, microwave plasma processing apparatuses using microwave plasma have attracted much attention.

In a plasma process, stable plasma generation is essential, and vacuum maintenance is important to achieve stable plasma generation. When a plasma process is performed, sealing prevents leakage of air or gas from a plasma generation chamber and entry of external air into the plasma generation chamber, thereby maintaining the plasma generation chamber in an airtight or vacuum state. An O-ring generally used in such sealing is prone to deterioration when the O-ring is exposed to plasma atmosphere, leading to generation of particles or degradation of sealing.

Japanese Laid-Open Patent Publication No. hei 6-112168 (hereinafter, referred to as reference 1) discloses a plasma processing apparatus which performs a uniform plasma process. A reaction vessel is made airtight through a conductive O-ring, by an upper electrode that forms a cover of the grounded reaction vessel. Even when the upper electrode is bent, the upper electrode is electrically connected to the reaction vessel, and thus the reaction vessel is grounded. Thus, no electrical disturbance occurs as high frequency, and no noise is generated. Consequently, a reaction gas is homogenously converted into plasma and thus a uniform plasma stream is generated. Accordingly, a semiconductor wafer is uniformly plasma-processed.

Japanese Laid-Open Patent Publication No. 2000-182958 (hereinafter, referred to as reference 2) discloses a vacuum device which detects external leakage in an early stage in order to minimize damage. The vacuum device includes a vacuum chamber, a vacuum chamber sealing member, and an inert gas seal-in member between the vacuum chamber sealing member and external air. The inert gas seal-in member prevents external air from entering the vacuum chamber when leakage occurs in the vacuum chamber. The inert gas seal-in member includes a first pressure monitoring mechanism which monitors the pressure of the inert gas seal-in member, and a second pressure monitoring mechanism which monitors the pressure of the vacuum chamber. Therefore, the vacuum device is able to detect leakage in an early stage.

Japanese Laid-Open Patent Publication No. 2004-99924 (hereinafter, referred to as reference 3) discloses a vacuum treatment system capable of improving corrosion resistance and completely preventing intrusion of air into a chamber. An outer sealing member and an inner sealing member are fitted into an outer groove and an inner groove, respectively, which are formed concentrically in contact parts where a wall and a ceiling plate that constitute the chamber abut on each other. A passage through which the outer sealing member and the inner sealing member communicate with each other is formed, and a helium gas, which supplies a pressure exceeding an atmospheric pressure, is filled into the passage. Therefore, the vacuum treatment system can improve corrosion resistance and completely prevent intrusion of air into the chamber.

Japanese Laid-Open Patent Publication No. 2004-141803 (hereinafter, referred to as reference 4) discloses a plasma processing apparatus which prevents particle generation caused by deterioration of an O-ring and also prevents deterioration of a sealing property. A gate valve is formed between a reaction chamber and a transfer chamber, and thus a metal mesh-shaped O-ring and a fluororesin-based O-ring are formed on the side of the reaction chamber and on the side of the transfer chamber, respectively. Therefore, plasma atmosphere is kept in the reaction chamber of the plasma processing apparatus.

A method of using two O-rings with two different functions is well known as a method of preventing reduction of the sealing property by suppressing deterioration of an O-ring as much as possible. However, this well-known method does not consider blockage of microwaves. In addition, an abnormal electric discharge occurs between the two O-rings, and thus plasma may be unstable.

The reference 2 focuses on detecting degradation of an O-ring and preventing leakage from occurring in a vacuum chamber, but provides no particular measures to prevent deterioration of the O-ring. The reference 3 protects an O-ring from being exposed to plasma atmosphere by using an inert gas, but a relatively expensive helium gas should be used as the inert gas so that the inert gas can penetrate through the O-ring.

SUMMARY OF THE INVENTION

To solve the above and/or other problems, the present invention provides a sealing structure of a plasma processing apparatus, a sealing method, and a plasma processing apparatus including the sealing structure, whereby plasma is stabilized and thus deterioration of sealing members is prevented.

According to an aspect of the present invention, there is provided a sealing structure included in a plasma processing apparatus seals an opening of a plasma generation chamber in which a plasma process is performed, the sealing structure including a ring-shaped first sealing member being exposed to a plasma in the plasma generation chamber; a ring-shaped second sealing member being not exposed to the plasma in the plasma generation chamber; a gap between the first sealing member and the second sealing member; a gas inlet injecting an inert gas into the gap; and a groove formed in a surface of the sealing structure, the surface facing the first sealing member, in a direction almost perpendicular to a length direction of the first sealing member, and connecting the plasma generation chamber to the gap.

The gap may be filled with an inert gas having a pressure that does not cause an abnormal electric discharge.

The sealing structure may further include a concave portion formed between the first and second sealing members, the concave portion extending along the length direction of the first or second sealing member.

The sealing structure may further include a pressure measuring unit measuring a pressure within the gap; and a degradation determination unit determining that the first sealing member has been degraded, if the pressure measured by the pressure measuring unit deviates from a predetermined range.

The sealing structure may further include a gas flow measuring unit measuring the amount of the inert gas injected into the gap; and a degradation determination unit determining that the first sealing member has been degraded, if the inert gas amount measured by the gas flow measuring unit deviates from a predetermined range.

The sealing structure may further include a pressure measuring unit measuring a pressure within the gap; and a degradation determination unit determining that the second sealing member has been degraded, if the pressure measured by the pressure measuring unit deviates from a predetermined range.

The sealing structure may further include a gas flow measuring unit measuring the amount of the inert gas injected into the gap; and a degradation determination unit determining that the second sealing member has been degraded, if the inert gas amount measured by the gas flow measuring unit deviates from a predetermined range.

The inert gas may include a combination of two or more of Ne, Ar, Kr, Xe, and $N_2$.

The second sealing member may be conductive.

The opening may include a blocking member sealing the opening; and a small-piece member forming a small gap between the blocking member and the plasma generation chamber.

The plasma generation chamber may include the opening through which an object to be processed is brought in or taken out, and a gate valve sealing the opening. The first and second sealing members may be located between a rim of the opening and a valve body of the gate valve.

The plasma generation chamber may include the opening which forms an upper side of the plasma generation chamber, and the opening may be sealed by a top plate. The first and second sealing members may be located between the rim of the opening and the top plate.

According to another aspect of the present invention, there is provided a method of sealing an opening of a plasma generation chamber in which a plasma process is performed, the method including the operations of compressing and attaching a ring-shaped first sealing member and a ring-shaped second sealing member to a rim of the opening while forming a gap between the first and second sealing members so that the first sealing member can contact a surface in which a groove connecting the plasma generation chamber to the gap between the first and second sealing members is formed, wherein the ring-shaped first sealing member is exposed to a plasma in the plasma generation chamber, the ring-shaped second sealing member is not exposed to the plasma in the plasma generation chamber, and the groove is formed in a direction almost perpendicular to a length direction of the first sealing member; and injecting an inert gas into the gap.

In the operation of injecting the inert gas into the gap, the inert gas may be injected under a pressure that does not cause an abnormal electric discharge within the gap.

A concave portion may be formed along the gap, and a pressure within the gap may be constant.

The method may further include the operations of measuring the pressure within the gap; and determining that the first sealing member has been degraded, if the pressure measured in the measuring of the pressure within the gap deviates from a predetermined range.

The method may further include the operations of measuring the amount of the inert gas injected into the gap; and determining that the first sealing member has been degraded, if the inert gas amount measured in the measuring of the gas flow deviates from a predetermined range.

The method may further include the operations of measuring a pressure within the gap; and determining that the second sealing member has been degraded, if the pressure measured in the measuring of the pressure within the gap deviates from a predetermined range.

The method may further include the operations of measuring the amount of the inert gas injected into the gap; and determining that the second sealing member has been degraded, if the inert gas amount measured in the measuring of the gas flow deviates from a predetermined range.

The inert gas may be a combination of two or more gases selected from Ne, Ar, Kr, Xe, and $N_2$.

According to another aspect of the present invention, there is provided a plasma processing apparatus including a plasma generation chamber in which a plasma process is performed; and the above-described sealing structure.

BRIEF DESCRIPTION OF THE DRAWINGS

The above and other features and advantages of the present invention will become more apparent by describing in detail exemplary embodiments thereof with reference to the attached drawings in which:

FIGS. 2A and 2B illustrate a gate valve corresponding to a sealing structure of the plasma processing apparatus of FIG. 1, according to an embodiment of the present invention, wherein FIG. 2A is a cross-section of a one-dot dashed line portion V of an opening of the plasma processing apparatus of FIG. 1, and FIG. 2B is a plan view of a valve body of the gate valve;

FIGS. 5A, 5B, and 5C illustrate a top plate corresponding to a sealing structure of the plasma processing apparatus, according to another embodiment of the present invention, wherein FIG. 5A is a cross-section of a one-dot dashed line portion C of the opening of the plasma processing apparatus of FIG. 1, FIG. 5B illustrates a modification of the portion C of FIG. 5A, and FIG. 5C is a cross-section taken along line M-M of FIG. 5B.

DETAILED DESCRIPTION OF THE INVENTION

The First Embodiment

Figure 1:
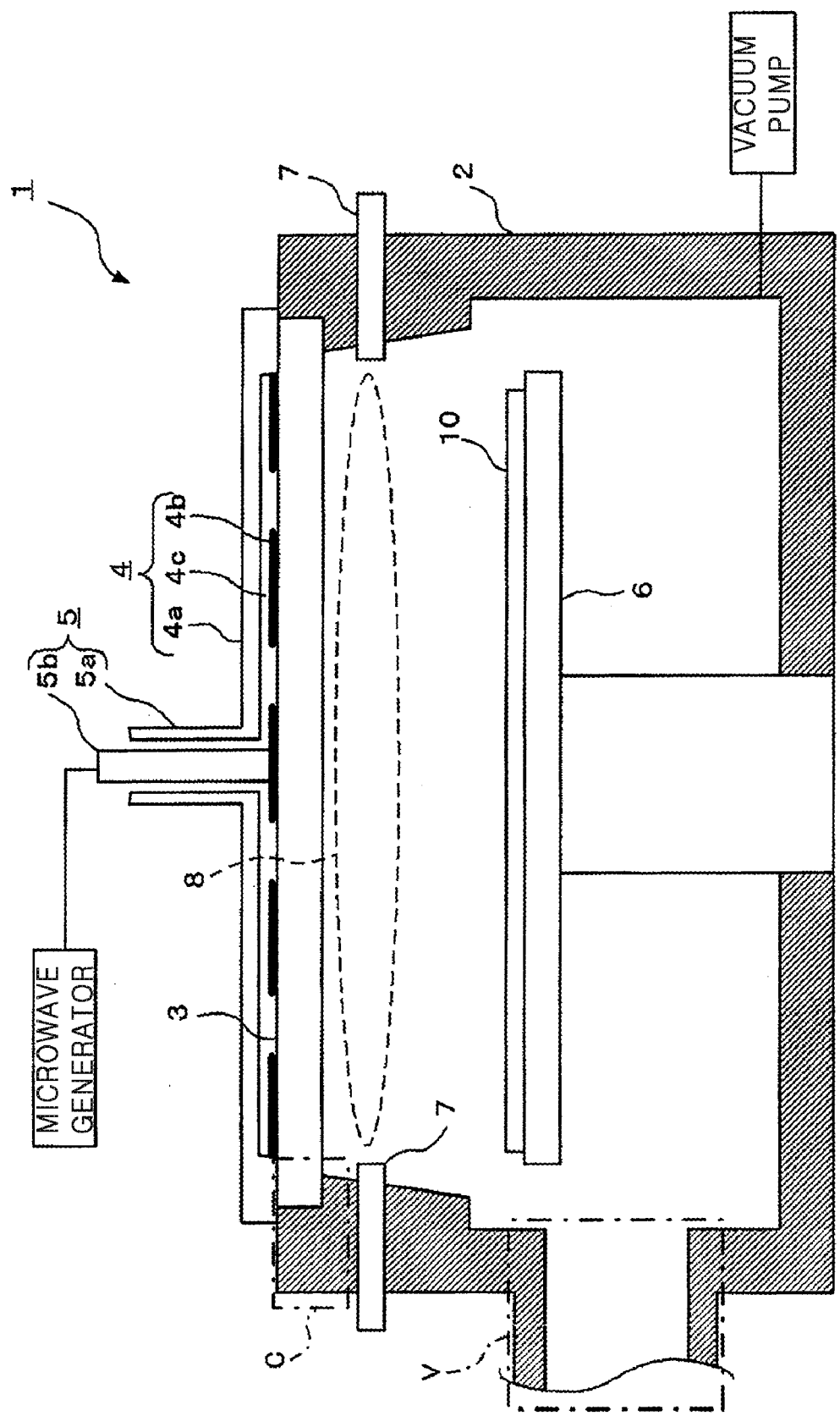
FIG. 1 is a cross-section of a plasma processing apparatus according to an embodiment of the present invention.
Figure 2A:
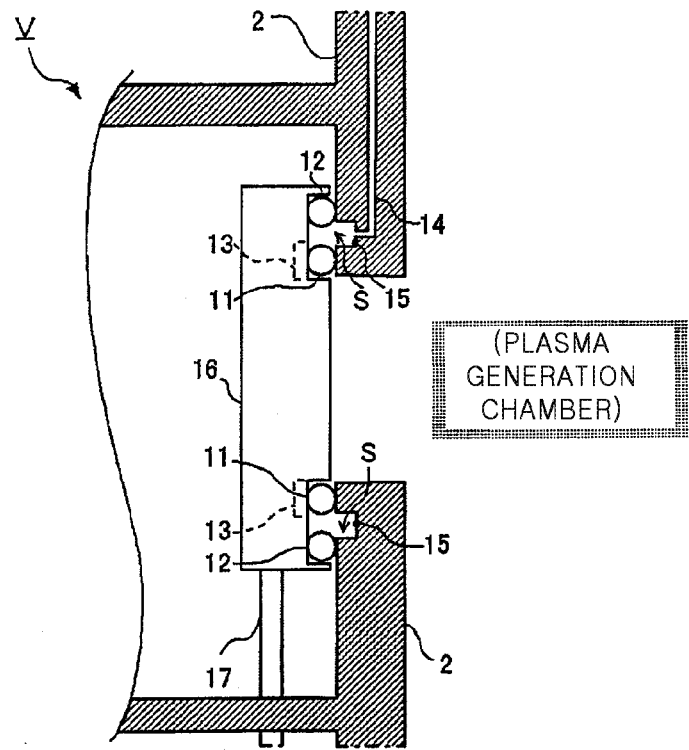
Figure 2B:
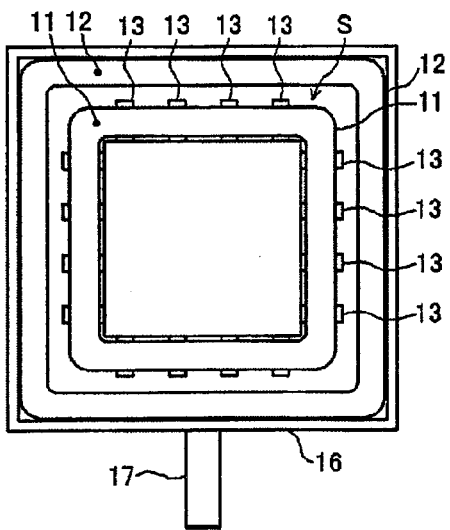

Hereinafter, a sealing structure for a plasma processing apparatus according to the present invention will be described in detail by explaining exemplary embodiments of the invention with reference to the attached drawings. Like reference numerals in the drawings denote like elements, and thus their description will be omitted. FIG. 1 is a cross-section of a plasma processing apparatus 1 according to an embodiment of the present invention. For example, a portion V illustrated in FIG. 1 is connected to a transfer side, and a gate valve is placed between a plasma generation chamber 2 and the transfer side. FIG. 2A is a cross-section of the gate valve that seals an opening of the plasma processing apparatus 1, according to an embodiment of the present invention. FIG. 2A illustrates the portion V surrounded by a one-dot dashed line in FIG. 1. FIG. 2B is a plan view of a valve body 16 of the gate valve.

The plasma processing apparatus 1 includes the plasma generation chamber 2, a top plate 3, an antenna 4, a waveguide 5, a substrate holder 6, and a gas inlet 7. The top plate 3 is formed of a dielectric that transmits microwaves, for example, quartz or alumina. The antenna 4 includes a waveguide portion (a shield member) 4a, a radial line slot antenna (RLSA) 4b, and a wavelength-shortening (dielectric) plate 4c. The wavelength-shortening plate 4c is formed of a dielectric material such as $SiO_2$ or $Al_2O_3$. The waveguide 5 has a coaxial structure including an outer waveguide 5a and an inner waveguide 5b.

Referring to FIGS. 2A and 2B, the gate valve includes the valve body 16, a valve stem 17, and ring-shaped sealing members 11 and 12 installed in the valve body 16. The sealing members 11 and 12 seal a gap between the valve body 16 and the plasma generation chamber 2. The sealing members 11 and 12 are fitted into grooves (not shown) formed in the valve body 16, and thus positions of the sealing members 11 and 12 may be fixed and positions where the valve body 16 contacts the plasma generation chamber 2 may also be fixed. The sealing member 11 is on the side of the plasma generation chamber 2 and is exposed to plasma atmosphere. However, the sealing member 12 is on the transfer side and is not exposed to plasma atmosphere. For example, the sealing member 11 may be an O-ring having plasma resistance and thermal resistance, and the sealing member 12 may be a conductive O-ring having thermal resistance and a sealing property.

The sealing members 11 and 12 do not contact each other, that is, a gap S is formed therebetween. A plurality of gas grooves 13 are formed in the valve body 16 including the sealing member 11 and arranged in the length direction of the sealing member 11. The gas grooves 13 are formed by the valve body 16 in a direction almost perpendicular to the length direction of the sealing member 11. Even when the valve body 16 pushes an opening of the plasma generation chamber 2 when the sealing member 11 is interposed between the valve body 16 and the plasma generation chamber 2, the gap S is in communication with the plasma generation chamber 2 via the gas grooves 13. A gas injection passage 14 for injecting a gas into the gap S is formed in the wall of the plasma generation chamber 2. A concave portion 15 extending along the length direction of the sealing member 11 is formed on the side of the plasma generation chamber 2, and the concave portion 15 is connected to a gas outlet of the gas injection passage 14.

After the substrate 10 is inserted into the plasma generation chamber 2, the valve stem 17 is raised to close the gate valve in order to cover the opening of the plasma generation chamber 2 with the valve body 16. The sealing members 11 and 12 contact closely the outer wall of the plasma generation chamber 2. An upper portion of the plasma generation chamber 2 is covered by the top plate 3, and the inside of the plasma generation chamber 2 is placed into a vacuum state with a pressure of about 10 mPa to several 10 Pa by a vacuum pump.

The antenna 4 is coupled to the upper surface of the top plate 3. The waveguide 5 is connected to the antenna 4. The waveguide portion 4a is connected to the outer waveguide 5a, and the RLSA 4b is coupled with the inner waveguide 5b. The wavelength-shortening plate 4c is disposed between the waveguide portion 4a and the RLSA 4b and compresses the wavelength of microwaves.

A microwave generator supplies microwaves to the plasma generation chamber 2 via the waveguide 5. The microwaves propagate in a radial direction in a space between the waveguide portion 4a and the RLSA 4b and are emitted via slots of the RLSA 4b. The microwaves pass through the top plate 3 and form polarization planes, thereby being formed as circularly polarized waves.

Before plasma 8 is formed within the plasma generation chamber 2, an inert gas is injected into the gap S between the sealing members 11 and 12 via the gas injection passage 14 so as to fill the gap S and the concave portion 15. The amount of injected inert gas is controlled so that a predetermined amount of inert gas can flow into the plasma generation chamber 2 via the gas grooves 13.

The inert gas may be argon (Ar), xenon (Xe), nitrogen ($N_2$), or the like, and may be the same type as an inert gas introduced into the plasma generation chamber 2 during plasma formation. Helium (He) may also be used as the inert gas, but is not suitable for general use because it is expensive.

As described above, the concave portion 15 extending along the length direction of the sealing member 11 is formed in the side of the plasma generation chamber 2. The concave portion 15 allows resistance of the inert gas flowing in the length direction of the sealing member 11 to be reduced, and thus at least the pressure of the gas introduced via the gas injection passage 14 may be stably and uniformly applied to around the sealing members 11 and 12. The amount of the inert gas injected into the gap S has a pressure under which an abnormal electric discharge does not occur in the gap S, preferably, a pressure of 4000 Pa or greater. For example, if the pressure of the inert gas is 4000 Pa, an abnormal electric discharge does not appear. At this time, a pressure in the gap S is higher than the inner pressure of the plasma generation chamber 2. Even if gas leakage occurs due to deterioration of the sealing member 11, the inert gas included in the plasma generation chamber 2 does not leak to the transfer side.

When the microwaves are fed into the plasma generation chamber 2 and thus the plasma 8 is generated, an inert gas such as Ar, Xe, or $N_2$ is injected into the plasma generation chamber 2 via the gas inlet 7, and a process gas such as hydrogen is also injected into the plasma generation chamber 2 as required, thereby forming Ar or Xe plasma. Thus, the substrate 10 installed on the substrate holder 6 may be plasma-processed using the plasma 8.

While the plasma 8 is being formed, the inert gas is being continuously supplied into the plasma generation chamber 2 via the gas grooves 13 formed along the length direction of the sealing member 11. The amount of the inert gas supplied into the gap S is less than the amount of the inert gas which is supplied into the plasma generation chamber 2 in order to form the plasma 8. The amount of the inert gas supplied into the gap S may be one third of the amount of the inert gas supplied into the plasma generation chamber 2. A layer of the inert gas is formed on a surface facing the plasma generation chamber 2 from among the entire surface of the sealing member 11, and protects the sealing member 11 from the plasma atmosphere (a radical) and an erosive gas. The sealing member 12 is also protected from the inert gas existing in the gap S and thus is not exposed to the plasma atmosphere (a radical). Therefore, deterioration of the sealing member 2 can be prevented. The sealing member 12 blocks the microwaves because it is formed of a conductive material, thereby preventing the microwaves from leaking to the transfer side.

Modification 1 of the First Embodiment

Figure 3:
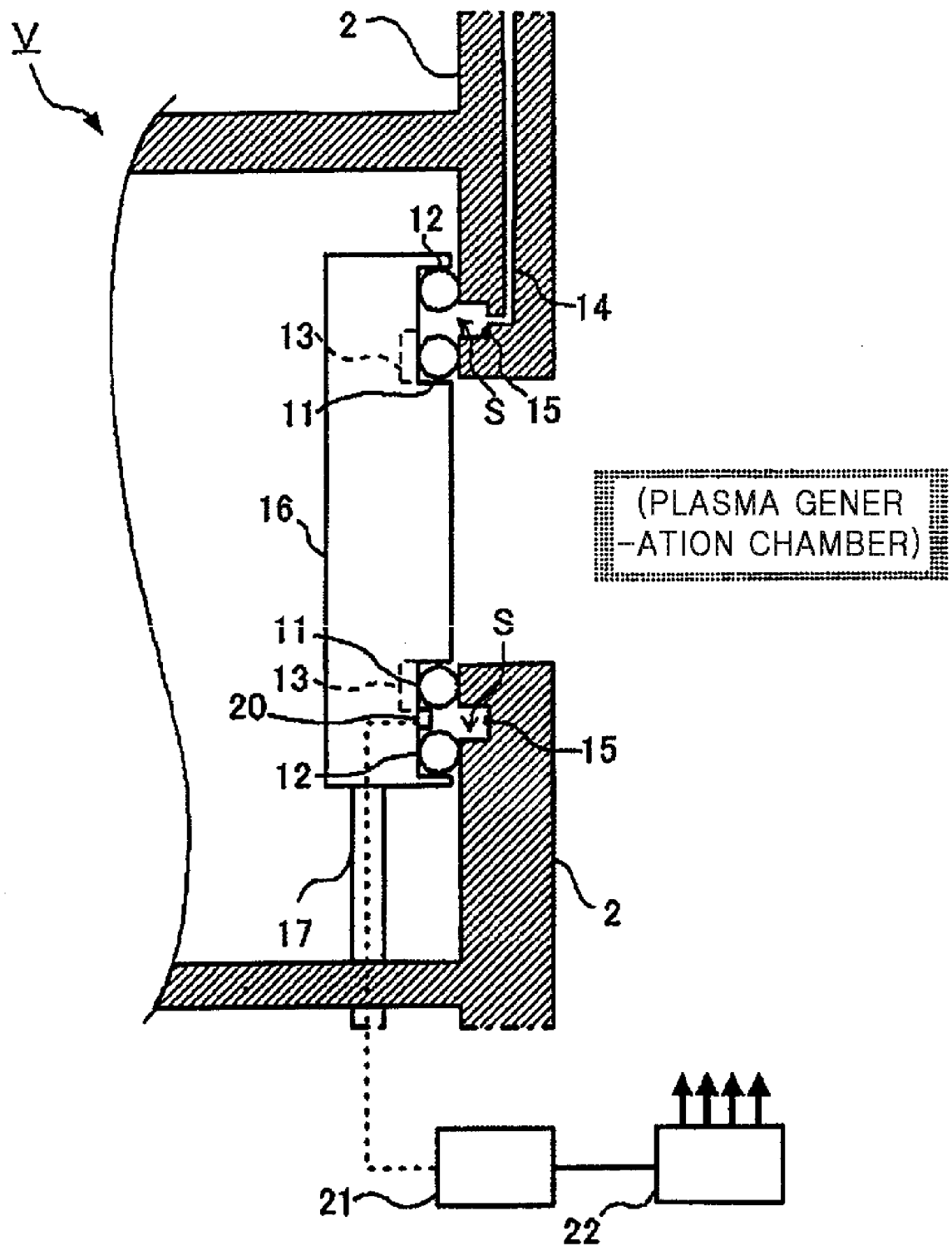
FIG. 3 is a cross-section of a gate valve corresponding to a sealing structure according to a modification of the embodiment illustrated in FIG. 2.

FIG. 3 is a cross-section of a gate valve corresponding to a sealing structure according to a modification of the embodiment illustrated in FIGS. 2A and 2B. The sealing structure of FIG. 3 is the same as that of FIGS. 2A and 2B except that the sealing structure of FIG. 3 includes a pressure sensor 20 installed on a surface that contacts the gap S and also the sealing structure of FIG. 3 is connected to a determination unit 21 and a control unit 22. The control unit 22 includes a processing unit, such as a computer, and a read only memory (ROM) that stores processing programs and the like, and controls entirely the plasma processing apparatus 1 and also controls the components thereof individually.

When the gap S and the concave portion 15 are filled with the inert gas, if the inert gas is continuously injected into the gap S and the concave portion 15, the inert gas is continuously exhausted from the gas grooves 13 into the plasma generation chamber 2. When the income and outgo of the inert gas is constant, the pressure is maintained constant.

The pressure sensor 20 measures the pressure within the gap S, and the measured pressure is transmitted as data to the determination unit 21. If the sealing member 11 is deteriorated, the inert gas is exhausted not only from the gas grooves 13 but also from a deteriorated portion of the sealing member 11, and thus the pressure within the gap S is reduced. A predetermined pressure range is pre-set in the determination unit 21, and if the measured pressure deviates from the predetermined pressure range, the determination unit 21 determines that the sealing member 11 has been deteriorated. The gap S, or a sum of the gap S and the concave portion 15 is sufficiently small compared with the space of the plasma generation chamber 2, and thus even a small pressure difference can be measured. Therefore, deterioration of the sealing member 11 can be easily detected.

If the determination unit 21 determines that the measured pressure is within the predetermined pressure range, an operation currently in progress continues. If the determination unit 21 determines that the measured pressure is out of the predetermined pressure range, the determination unit 21 determines that the sealing member 11 has been deteriorated, and sends information about the deterioration to the control unit 22. The system of the plasma processing apparatus 1 operates under the control of the control unit 22. For example, the deterioration of the sealing member 11 may be recognized from operations such as a suspension of the plasma processing apparatus 1 and generation of abnormal sounds from a buzzer.

The pressure sensor 20 may be replaced by a flow measuring unit for measuring the amount of inert gas supplied into the gap S. In this case, if the amount of inert gas supplied to the gap S exceeds a predetermined range, the determination unit 21 determines that the sealing member 11 has been degraded. By operating the determination unit 21 in connection with the control unit 22, the plasma processing apparatus 1 is paused when deterioration of the sealing member 11 has been detected. Accordingly, a suitable countermeasure such as a replacement of the degraded sealing member 11 may be made.

Degradation of the sealing member 12 may also be determined, like in case of the sealing member 11. The sealing member 12 is not exposed directly to the plasma atmosphere, and thus it has a longer durability and a less replacement frequency than the sealing member 11. However, the sealing member 12 still may be degraded after a predetermined period of time. When a plasma process is performed, the plasma generation chamber 2 needs to be sealed, and the pressure of the plasma generation chamber 2 needs to be reduced to a predetermined pressure by the vacuum pump. If the pressure of the plasma generation chamber 2 increases with the passage of time, it may be determined that the sealing member 12 has been degraded.

By measuring the pressure within the gap S using the pressure sensor 20, the degradation of the sealing member 12 may be detected early. When the gap S and the concave portion 15 are filled with the inert gas, if the amounts of inert gas injected and exhausted are constant, the pressure within the gap S may be maintained constant. The pressure within the gap S is about 4000 Pa, and the pressure of the transfer side is lower than or equal to an atmospheric pressure and is greatly higher than the pressure within the gap S. If the sealing member 12 is degraded, the inert gas moves from the transfer side toward the gap S, and thus the pressure within the gap S is increased. If the pressure within the gap S exceeds a predetermined pressure range, it is determined that the sealing member 12 has been degraded.

Similar to the case of the sealing member 11, a determination with respect to the pressure of the sealing member 12 is made in the determination unit 21, and information about a result of the determination is transmitted to the control unit 22. If it is determined that the sealing member 12 has been degraded, the system of the plasma processing apparatus 1 operates by the control unit 22. For example, the degradation of the sealing member 12 may be recognized from a suspension of operation of the plasma processing apparatus 1, generation of abnormal sounds from a buzzer, or other operations. Although the pressure sensor 20 is illustrated in the FIG. 3, a flow measuring unit for measuring the amount of inert gas supplied to the gap S may be used instead.

Modification 2 of the First Embodiment

Figure 4A:
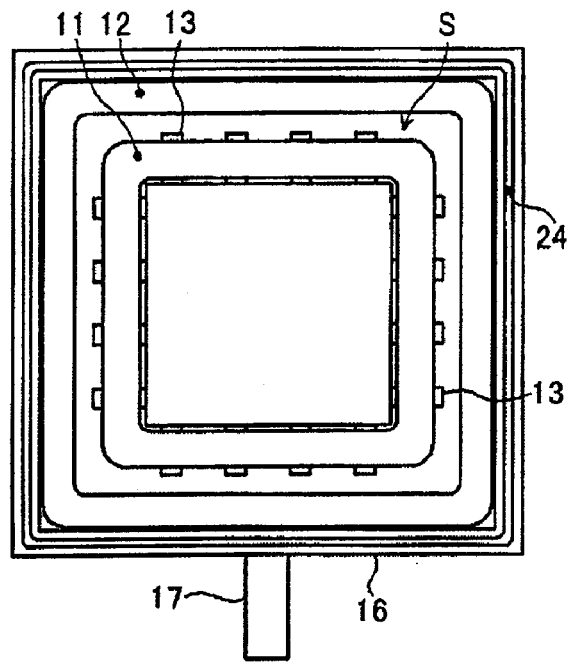
FIGS. 4A, 4B, 4C, and 4D illustrate plan views and cross-sections of a gate value corresponding to a sealing structure according to another modification of the embodiment illustrated in FIG. 2.
Figure 4B:
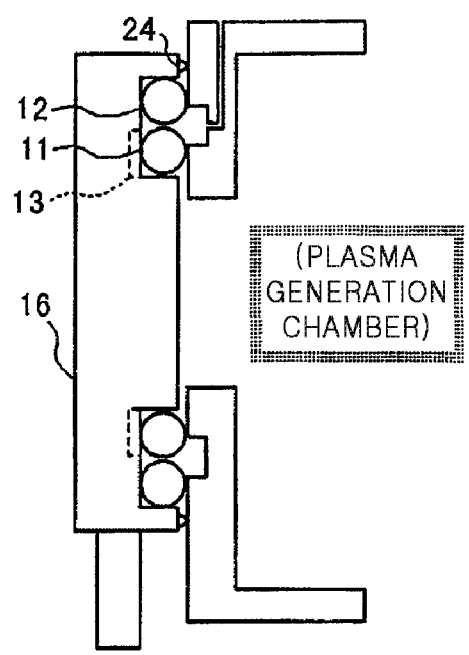
Figure 4C:
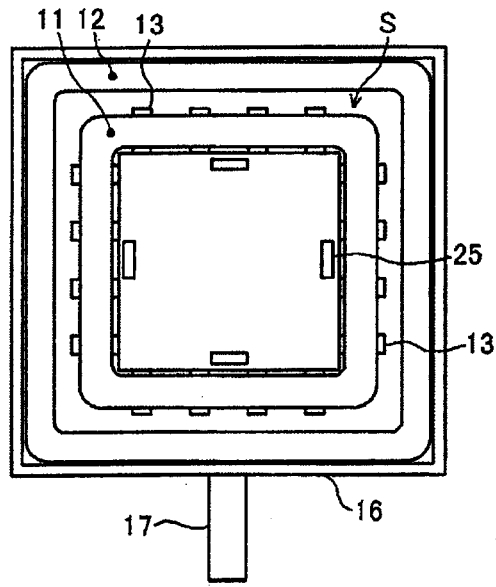
Figure 4D:
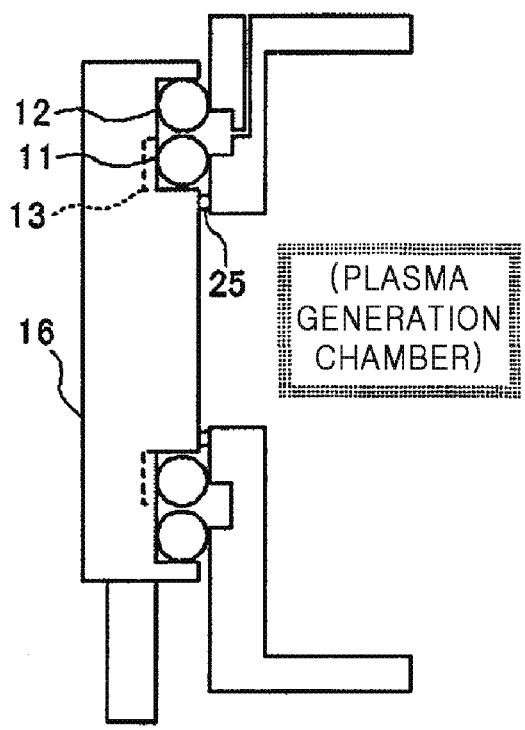

FIGS. 4A, 4B, 4C, and 4D are plan views and cross-sections of a gate value corresponding to a sealing structure according to another modification of the embodiment illustrated in FIG. 2. In this modification, a spacer is included between the plasma generation chamber 2 and the valve body 16 of the gate valve. FIG. 4A is a plan view of a valve when a ring-shaped spacer 24 is installed on a rim of the valve body 16, and FIG. 4B is a cross-section of the valve of FIG. 4A. FIG. 4C is a plan view of a valve when a plurality of small spacers 25 are installed on a portion close to the opening of the plasma generation chamber 2 from among the entire surface of the valve body 16, and FIG. 4D is a cross-section of the valve of FIG. 4C.

If the plasma generation chamber 2 directly contacts the valve body 16, generation of particles due to friction between the plasma generation chamber 2 and the valve body 16, insufficiency of the sealing property, or other problems may occur. Accordingly, the plasma generation chamber 2 and the valve body 16 need to contact each other via the sealing members 11 and 12 instead of directly contacting each other.

When a plasma process is performed, the gate valve is closed to cover the opening of the plasma generation chamber 2 with the valve body 16, and the inside of the plasma generation chamber 2 is placed in a vacuum state having a pressure of about 10 mPa to several 10 Pa by the vacuum pump. The pressure of the transfer side is less than or equal to an atmospheric pressure, but is sufficiently high compared with the pressure of the plasma generation chamber 2, and thus the valve body 16 that covers the opening of the plasma generation chamber 2 is pushed against the outer wall of the plasma generation chamber 2 by a pressure applied from the transfer side to the plasma generation chamber 2.

The sealing members 11 and 12 on the valve body 16 closely contact the outer wall of the plasma generation chamber 2. At this time, the sealing members 11 and 12 are appropriately compressed. If the sealing members 11 and 12 are degraded or the sealing members 11 and 12 are compressed and become smaller than a predetermined size by a large pressure applied to the valve body 16, the plasma generation chamber 2 and the valve body 16 may contact each other. However, a predetermined gap may be formed between the plasma generation chamber 2 and the valve body 16 by the spacers 24 and 25 installed on the valve body 16, thereby preventing the plasma generation chamber 2 and the valve body 16 from contacting each other.

In the plasma process, the inside temperature of the plasma generation chamber 2 increases, and thus the sealing members 11 and 12 may be expanded by heat. Even in this case, the plasma generation chamber 2 should be continuously sealed, and thus the sealing members 11 and 12 need to have a sufficient sealing property. Therefore, the gap formed by the spacers 24 and 25 may be set to be less than or equal to 0.3 mm, that is, about 0.1~0.3 mm, while the temperature of the plasma generation chamber 2 is increasing.

The spacers 24 and 25 may be ring-shaped spacers as illustrated in FIGS. 4A and 4B. Alternatively, the spacers 24 and 25 may be small pieces as illustrated in FIGS. 4C and 4D. The spacers 24 and 25 may be installed on the rim of the valve body 16 or a portion covering the opening of the plasma generation chamber 2 from among the entire area of the valve body 16. Alternatively, the spacers 24 and 25 may be installed on the plasma generation chamber 2, not on the valve body 16. For example, the spacers 24 and 25 may have heat resistance and hardenability.

The Second Embodiment

Figure 5A:
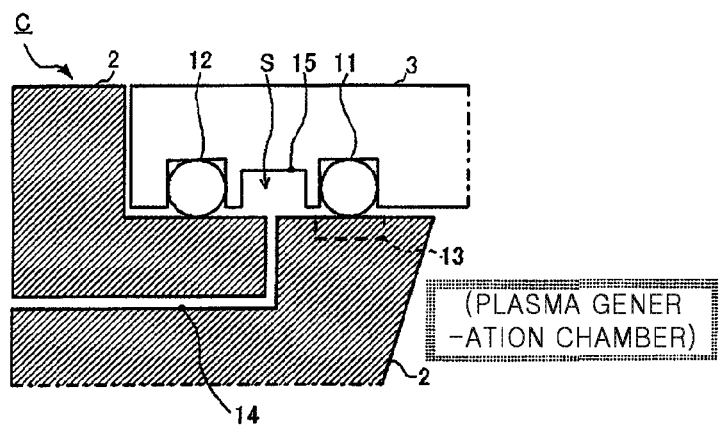
Figure 5B:
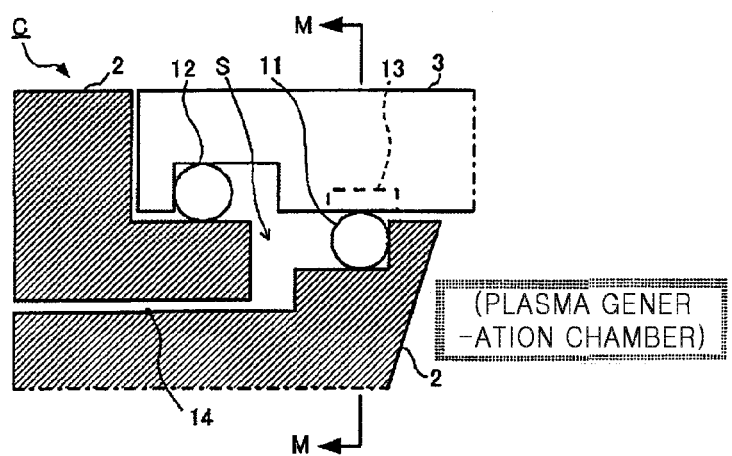
Figure 5C:
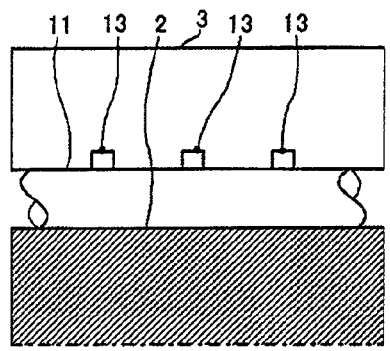

FIGS. 5A, 5B, and 5C are cross-sections of a top plate 3 corresponding to a sealing structure of the plasma processing apparatus 1, according to another embodiment of the present invention, wherein the top plate 3 seals the opening of the plasma processing apparatus 1. FIG. 5A is a cross-section of a one-dot dashed line portion C of the plasma processing apparatus 1 of FIG. 1, and illustrates a case where two sealing members 11 and 12 are included in the top plate 3. FIG. 5B is a modification of the embodiment of FIG. 5A and illustrates a case where the sealing members 11 and 12 are included in the top plate 3 and the plasma generation chamber 2, respectively, or vice versa. FIG. 5C is a cross-section taken along line M-M of FIG. 5B. The plasma processing apparatus 1 of FIGS. 5A, 5B, and 5C is the same as that of FIG. 1. The transfer side of the plasma processing apparatus 1 of FIGS. 5A, 5B, and 5C may be blocked, and the plasma generation chamber 2 thereof may be of a box type with only an upper side open.

After the substrate 10 is inserted into the plasma generation chamber 2, the transfer side is blocked if it is open. Thereafter, the plasma generation chamber 2 is placed in a vacuum state by the vacuum pump, and the inert gas is filled in the gap S between the sealing members 11 and 12. The top plate 3 has a concave portion 15 extending along the length direction of the sealing member 11. The concave portion 15 allows resistance of the inert gas flowing in the length direction of the sealing member 11 to be reduced, and thus at least the pressure of the gas introduced via the gas injection passage 14 may be stably and uniformly applied to around the sealing members 11 and 12. Even when the top plate 3 does not include the concave portion 15 as illustrated in FIG. 5B, a stable and uniform pressure may be applied to the sealing members 11 and 12 by making the gap S between the sealing members 11 and 12 larger.

The amount of inert gas injected into the gap S via the gas injection passage 14 is controlled so that the inert gas is continuously exhausted via a plurality of gas grooves 13 via which the gap S communicates with the plasma generation chamber 2. The amount of inert gas injected into the gap S has a constant pressure under which an abnormal electric discharge does not occur in the gap S, for example, 4000 Pa. Accordingly, physical or electrical damage to the substrate 10 due to an abnormal electric discharge is prevented, and stable plasma can be formed.

While plasma is being formed, the inert gas is continuously exhausted from the gas grooves 13 formed along the length direction of the sealing member 11 into the plasma generation chamber 2, as illustrated in FIG. 5C. A layer of the inert gas is formed on a surface facing the plasma generation chamber 2 from among the entire surface of the sealing member 11, and thus protects the sealing member 11 from the plasma atmosphere (a radical) and erosive gas. The sealing member 12 is also protected by the inert gas in the gap S and is not exposed to the plasma atmosphere (a radical), thereby preventing degradation of the sealing member 12.

The top plate 3 is formed of a dielectric and propagates microwaves. The sealing member 12 is conductive and thus blocks the microwaves. Since the sealing member 12 electrically contacts the plasma generation chamber 2, no noise is generated and plasma is stably generated without disturbance of a plasma stream.

Similar to the modification of FIG. 3, the sealing structure of FIGS. 5A, 5B, and 5C may include the pressure sensor 20 installed on a surface that faces the gap S. Since the pressure sensor 20 is connected to the determination unit 21 and the control unit 22, the pressure sensor 20 may be installed on the plasma generation chamber 2, not the top plate 3. The pressure sensor 20 may be replaced by a flow measuring unit that measures the amount of inert gas supplied into the gap S.

Similar to the modification of FIGS. 4A through 4D, the sealing structure of FIGS. 5A, 5B, and 5C may include spacers 24 and 25 for forming a small gap between the plasma generation chamber 2 and a blocking member (the top plate 3) for sealing the opening of the plasma generation chamber 2. The gap formed between the plasma generation chamber 2 and the top plate 3 by the spacers 24 and 25 may have a size that allows sufficient sealability to be maintained during a plasma process, for example, about 0.1~0.3 mm. The spacers 24 and 25 may have various shapes according to installation conditions, such as, small pieces or rings. The spacers 24 and 25 may be installed on the top plate 3 or on the plasma generation chamber 2.

In the sealing structures according to the above-described embodiments, the inert gas supplied to the gap S may be He, neon (Ne), or krypton (Kr), in addition to Ar, Xe, or $N_2$.

In the embodiment of FIGS. 2A through 4D, the sealing members 11 and 12 may be both installed on the outer wall of the plasma generation chamber 2 or on the valve body 16 of the gate valve. Alternatively, the sealing members 11 and 12 may be installed on the plasma generation chamber 2 and the valve body 16, respectively, or vice versa. In the embodiment of FIGS. 5A through 5C, the sealing members 11 and 12 may be both installed on the plasma generation chamber 2 or on the top plate 3. Alternatively, the sealing members 11 and 12 may be installed on the plasma generation chamber 2 and the top plate 3, respectively, or vice versa.

Places where the gas grooves 13 via which the gap S communicates with the plasma generation chamber 2 and the concave portion 15 for increasing the gap S are formed are not limited to the plasma generation chamber 2. In other words, the gas grooves 13 and the concave portion 15 may be formed in the valve body 16 or the top plate 3. The size or shape of the concave portion 15 is not limited to the above-described examples. By installing the sealing members 11 and 12 apart from each other or enlarging insertion portions of the sealing members 11 and 12, even when the concave portion 15 is not included, a gas with stable and uniform pressure may be applied to around the sealing members 11 and 12.

The gas injection passage 14 via which gas is supplied into the gap S may be formed not in the plasma generation chamber 2 but in the valve body 16.

The sealing members 11 and 12 may be rings with a cross-section of a D shape or a rectangle with rounded corners, instead of being O-rings. The material of the sealing members 11 and 12 is not limited to the above-described examples, such as functional resin or metal, and may be selected arbitrarily.

In the above-described embodiments of the present invention, the plasma processing apparatus 1 is illustrated, but one of a plurality of processing units included in a semiconductor manufacturing apparatus may be used as a unit for performing a plasma process. A plasma process may be plasma chemical vapor deposition (CVD), etching, sputtering, or the like. A substrate on which the plasma process is performed is not limited to a semiconductor substrate. A sealing structure according to the present invention is useful to seal an opening of a plasma generation chamber included in a plasma processing apparatus, and the present invention is not limited to the above-described embodiments.

In a sealing structure of a plasma processing apparatus, a sealing method, and a plasma processing apparatus including the sealing structure according to the present invention, plasma is stabilized, and thus degradation of sealing members is prevented.

What is claimed is:

1. A sealing structure of a plasma processing apparatus, which seals an opening of a plasma generation chamber in which a plasma process is performed, the sealing structure comprising:
   a body for covering the opening of the plasma generation chamber;
   a ring-shaped first sealing member disposed between the body and a wall of the plasma generation chamber, the first sealing member being exposed to inside of the plasma generation chamber;
   a ring-shaped second sealing member disposed between the body and the wall of the plasma generation chamber and outer to a ring shape of the first sealing member to provide a gap between the first sealing member and the second sealing member, the second sealing member being not exposed to the inside of the plasma generation chamber;
   a gas inlet for injecting an inert gas into the gap; and
   one or more grooves formed in the body or in the wall of the plasma generation chamber in a direction substantially perpendicular to the length direction of the first sealing member in such a manner that the inert gas injected into the gap flows through the grooves into the inside of the plasma generation chamber.

2. The sealing structure of claim 1, wherein the gap is filled with the inert gas having a pressure that does not cause an abnormal electric discharge.

3. The sealing structure of claim 1, further comprising:
   a concave portion formed in the body or in the wall of the plasma generation chamber between the first and second sealing members, the concave portion extending along the length direction of the first or second sealing member, or
   a concave portion formed in the body or in the wall of the plasma generation chamber wherein at least one of the first and second sealing member is disposed in the concave portion.

4. The sealing structure of claim 1, further comprising:
   a pressure measuring unit for measuring a pressure within the gap; and
   a degradation determination unit for determining that the first sealing member has been degraded, if the pressure measured by the pressure measuring unit deviates from a predetermined range.

5. The sealing structure of claim 1, further comprising:
   a gas flow measuring unit for measuring the amount of the inert gas injected into the gap; and
   a degradation determination unit for determining that the first sealing member has been degraded, if the inert gas amount measured by the gas flow measuring unit deviates from a predetermined range.

6. The sealing structure of claim 1, further comprising:
   a pressure measuring unit for measuring a pressure within the gap; and
   a degradation determination unit for determining that the second sealing member has been degraded, if the pressure measured by the pressure measuring unit deviates from a predetermined range.

7. The sealing structure of claim 1, further comprising:
   a gas flow measuring unit measuring the amount of the inert gas injected into the gap; and
   a degradation determination unit determining that the second sealing member has been degraded, if the inert gas amount measured by the gas flow measuring unit deviates from a predetermined range.

8. The sealing structure of claim 1, wherein the inert gas comprises a combination of two or more of Ne, Ar, Kr, Xe, and $N_2$.

9. The sealing structure of claim 1, wherein the second sealing member is conductive.

10. The sealing structure of claim 1, wherein the opening comprises:
    a blocking member for sealing the opening; and
    a small-piece member for forming a small gap between the blocking member and the plasma generation chamber.

11. The sealing structure of claim 1, wherein
    the opening is an opening through which an object to be processed is brought in or taken out from the plasma generation chamber, and the body is a valve body of a gate valve for sealing the opening, and
    the first and second sealing members are located between a rim of the opening and a the valve body of the gate valve.

12. The sealing structure of claim 1, wherein
    the opening is an opening which forms an upper side of the plasma generation chamber, and the body is a body of a top plate for sealing the opening, and
    the first and second sealing members are located between the rim of the opening and the top plate.

13. A method of sealing an opening of a plasma generation chamber in which a plasma process is performed, the method comprising the steps of:
    providing a sealing structure comprising:
       a body for covering the opening of the plasma generation chamber, a ring-shaped first sealing member and a ring-shaped second sealing member between the body and the wall of the plasma generation chamber while forming a gap between the first and second sealing members wherein the second sealing member is disposed outer to a ring shape of the first sealing member, and one or more grooves formed in the body or in the wall of the plasma generation chamber in a direction substantially perpendicular to the length direction of the first sealing member to provide a fluid-communication channel between the gap and inside of the plasma generation chamber, covering the opening with the sealing structure by compressing and attaching the first sealing member and the second sealing member to a rim of the opening, wherein the first sealing member is exposed to inside of the plasma generation chamber, the second sealing member is not exposed to the inside of the plasma generation chamber; and injecting an inert gas into the gap between the first and second sealing members.

14. The method of claim 13, wherein in the step of injecting of the inert gas into the gap, the inert gas is injected under a pressure that does not cause an abnormal electric discharge within the gap.

15. The method of claim 13, wherein a concave portion is formed along the gap, and a pressure within the gap is constant.

16. The method of claim 13, further comprising the steps of:

measuring the pressure within the gap; and determining that the first sealing member has been degraded, if the pressure measured in the measuring of the pressure within the gap deviates from a predetermined range.

17. The method of claim 13, further comprising the steps of:

measuring the amount of the inert gas injected into the gap; and determining that the first sealing member has been degraded, if the inert gas amount measured in the measuring of the gas flow deviates from a predetermined range.

18. The method of claim 13, further comprising the steps of:

measuring a pressure within the gap; and determining that the second sealing member has been degraded, if the pressure measured in the measuring of the pressure within the gap deviates from a predetermined range.

19. The method of claim 13, further comprising the steps of:

measuring the amount of the inert gas injected into the gap; and determining that the second sealing member has been degraded, if the inert gas amount measured in the measuring of the gas flow deviates from a predetermined range.

20. The method of claim 13, wherein the inert gas comprises a combination of two or more gases selected from Ne, Ar, Kr, Xe, and $N_2$.

21. A plasma processing apparatus comprising:

a plasma generation chamber in which a plasma process is performed; and a sealing structure described in claim 1.

* * * * *